(12) United States Patent
Hummel et al.

(10) Patent No.: US 6,583,850 B2
(45) Date of Patent: Jun. 24, 2003

(54) OPTICAL SYSTEM

(75) Inventors: Wolfgang Hummel, Schwäb. Gmünd (DE); Hubert Holderer, Königsbronn (DE); Rudolf Von Bünau, Essingen (DE); Christian Wagner, Aalen (DE); Jochen Becker, Obenkochen (DE); Stefan Xalter, Obenkochen (DE)

(73) Assignee: CARL-Zeiss-Stiftung (DE)

( * ) Notice: Subject to any disclaimer, the term of this patent is extended or adjusted under 35 U.S.C. 154(b) by 0 days.

(21) Appl. No.: 09/755,401

(22) Filed: Jan. 5, 2001

(65) Prior Publication Data

US 2001/0008440 A1 Jul. 19, 2001

(30) Foreign Application Priority Data

Jan. 5, 2000 (DE) .......................................... 100 00 193

(51) Int. Cl.[7] .................... G03B 27/52; G03B 27/42; G03B 27/54; G03L 5/00
(52) U.S. Cl. ................... 355/30; 355/53; 355/55; 355/67; 430/311; 430/312; 430/30
(58) Field of Search ..................... 355/30, 53, 55, 355/67; 430/311, 312, 30

(56) References Cited

U.S. PATENT DOCUMENTS

| | | |
|---|---|---|
| 2,836,101 A | 5/1958 | Swart |
| 4,097,126 A | 6/1978 | Mahlein et al. |
| 4,408,874 A | 10/1983 | Zinky et al. |
| 4,676,614 A | 6/1987 | Ohno |
| 4,676,631 A | 6/1987 | Kosugi et al. |
| 4,699,505 A | 10/1987 | Komoriya et al. |
| 4,780,747 A | 10/1988 | Suzuki et al. |
| 4,871,237 A | 10/1989 | Anzai et al. |
| 4,961,001 A | 10/1990 | Liegel et al. |
| 4,974,018 A | 11/1990 | Komoriya et al. |
| 5,025,284 A | 6/1991 | Komoriya et al. |
| 5,337,097 A | 8/1994 | Suzuki et al. |
| 5,852,490 A | 12/1998 | Matsuyama |
| 5,883,704 A * | 3/1999 | Nishi et al. .................. 355/67 |
| 5,969,802 A | 10/1999 | Takahashi et al. |

FOREIGN PATENT DOCUMENTS

WO PCT/DE97/00681 10/1997

* cited by examiner

Primary Examiner—Russell Adams
Assistant Examiner—Khaled Brown
(74) Attorney, Agent, or Firm—Factor & Partners

(57) ABSTRACT

An optical element (1) of an optical system has at least one chamber (5) that is sealed against atmospheric pressure and is enclosed by boundary surfaces and that has a fluid filling. At least one of the boundary surfaces of the chamber (5) is exposed at least partially to illumination light. It is configured so that a change in the fluid pressure inside the chamber (5) results in a change in non-rotational-symmetric imaging properties of the optical element (1) having n-fold symmetry. For this purpose, a fluid source has a fluid connection to the chamber via a fluid supply line (17). Furthermore, a control device is provided for the pressure in the fluid filling.

24 Claims, 4 Drawing Sheets

OPTICAL SYSTEM

The invention relates to an optical system, in particular a projection exposure system for microlithography, in particular having a slot-shaped image field or non-rotational-symmetric illumination, a) having an optical element comprising at least one chamber that is sealed from atmospheric pressure and is enclosed by boundary surfaces and that has a fluid filling, wherein at least one of the boundary surfaces is exposed at least partially by illumination light;

b) fluid source that has a fluid connection to the chamber via a fluid supply line; and c) control device for the pressure of the filling liquid.

Such a system is described in U.S. Pat. No. 4,676,631 A. In that case, to adjust the projection enlargement of a projection exposure system, an optical element is used that is disposed between a projection optics system and a laser. The optical element comprises two transparent plates that form the boundary of a gastight cavity with a common mounting. The transparent plates are deformed by means of a controllable internal gas pressure in a defined manner so that they act like a lens of controllable positive refractive power. Only the adjustment of the projection enlargement, that is to say of a rotational-symmetric imaging property, is possible with such an arrangement. Non-rotational-symmetric imaging properties, for example, to compensate for non-rotational-symmetric imaging errors, are, on the other hand, not adjustable.

It is precisely in projection exposure systems, but also in other optical systems, that it has been found that their imaging quality is often reduced by a variable astigmatism. Variable astigmatism arises, for example, as a result of non-rotational-symmetric light-induced effects, such as heating or "compaction", that result in a corresponding astigmatic expansion or refractive-index distribution in the optical element. Variable astigmatic lens effects, dependent for example on the pump intensity, also occur in solid-state laser media. In that case, either a birefringence is induced by the pump light or the oscillating laser light, or a birefringence already present in the laser medium is amplified, which often results in a variable astigmatism in the laser resonator.

It is known, for example, from EP 0 678 768 A2 to compensate for the light-induced astigmatic imaging error in a lens by an astigmatism artificially produced by means of a non-rotational-symmetric annealing of the lens material. However, due to the poor thermal conduction of most lens materials, this compensation mechanism has undesirably long time constants.

In addition, for certain optical applications, further circumstances are conceivable in which it is desirable to produce a variable astigmatism in a defined manner.

It is therefore the object of the present invention to develop an optical system of the type mentioned at the outset in such a way that it is possible to produce in said system an additional variable astigmatism that can be used, for example, for compensation purposes.

This object is achieved, according to the invention, by a system, wherein the enclosed chamber is configured in such a way that a change in the fluid pressure inside the at least one chamber results in a change in non-rotational-symmetric imaging properties of the optical element that have an n-fold symmetry relative to the optical axis of the optical element, where n is greater than 1.

The invention therefore continues the basic idea, disclosed in U.S. Pat. No. 4,671,631 A, of changing the optical properties of an element by means of the gas pressure and, as a result of the pressure-induced change in the non-rotational-symmetric imaging properties with n-fold symmetry, now also opens up the possibility of compensating corresponding imaging errors that occur.

The change in the fluid pressure inside the at least one chamber may result in a change in the astigmatic properties of the optical element. Astigmatism is a particularly frequently occurring non-rotational-symmetric imaging error having two-fold symmetry that can be corrected by such an optical element.

In a preferred refinement of the invention, at least that region of the surfaces forming the boundary of the chamber that is irradiated by illumination light is at least partially formed by an elastically deformable medium, the edge contour of the elastically deformable region being non-rotational-symmetric. An elastically deformable medium having a non-rotational-symmetric edge contour bulges in selected, mutually perpendicular planes in such a way that different curvatures are present at those points. Depending on the pressure of the fluid filling, the focal length ratio of such an astigmatic optical element changes in mutually perpendicular meridional planes. In total, this results in an easy-to-implement compensation element for a variable astigmatism.

The edge contour has an n-fold symmetry relative to the optical axis of the optical element, where n is greater than 1. The edge contour that can be adapted in this way to the symmetry of the imaging error to be corrected results in the possibility of correcting in a controlled manner certain n-fold imaging errors, but leaving other imaging properties having a different n-fold symmetry unaltered.

The edge contour may be elliptically shaped. Such an edge contour can easily be specified and therefore manufactured in an automated way. The ratio of the imaging properties in the mutually perpendicular meridional planes can be adjusted in a simple manner by means of the length ratio of the major axes of the ellipse.

Alternatively, the edge contour may have the shape of a polygon. Such edge contours can easily be produced.

Preferably, the elastically deformable optical medium is held in its edge region by a holding device, the shape of the holding surface with which the optical medium is in contact with the holding device imposes the edge contour of the elastically deformable surface region. In this way, a non-rotational-symmetric edge contour of an elastically deformable medium can easily be achieved.

The optical medium may be a pellicle. Such optical membranes have a very good optical quality and can be bent by relatively moderate fluid pressure changes.

Alternatively, the optical medium may be a quartz plate or a $CaF_2$ plate. Quartz plates have good optical properties and can be produced with such small thicknesses that they can be deformed in a defined manner even by moderate pressure changes. $CaF_2$ plates have good transparency, in particular, in the ultraviolet wavelength range of interest for projection exposure.

The optical medium may have a reflecting coating. The optical element can then be used as an imaging-correcting mirror.

An alternative embodiment is one wherein at least one region of a surface of the surfaces forming the boundary of the chamber is irradiated by illumination light and is formed by at least one rigid optical surface having different curvature in mutually perpendicular planes. In this embodiment, use is made of the effect that the change in the deflection of transmitted light rays as a consequence of a pressure-induced refractive index change in the fluid filling depends on the absolute value of the angle of incidence or angle of emission of the optical interfaces of the chamber for the fluid filling. In this embodiment, therefore, changing the fluid pressure also makes it possible to adjust the astigmatism of the optical element.

At the same time, the optical element is preferably formed from a combination of at least two optical components that each comprise at least one chamber that is sealed from atmospheric pressure and is enclosed by boundary surfaces, that has a fluid filling and that is irradiated by illumination light, the optical components having, at least in the region of one surface of the surfaces forming the boundary of the respective chambers in each case at least one optical surface having different curvature in mutually perpendicular planes; and an independent control of the pressure of the fluid filling in the chambers assigned to the optical components is ensured by means of the control device. Larger regions of astigmatisms to be adjusted can be covered by using a plurality of optical components having fluid-pressure-dependent astigmatism.

The optical element can be designed in this case so that, given equal pressure in the fluid filling in the chambers assigned to the optical components, it has essentially rotational-symmetric imaging properties. The optical element then has essentially no astigmatism in a neutral state in which the same pressure prevails in both chambers. In an optical arrangement in which rotational-symmetric imaging properties are required, astigmatisms of light-induced origin, for example, can then be compensated for on the basis of this neutral state.

Alternatively, the optical element can be designed so that, given equal pressure in the fluid filling in the chambers assigned to the optical components, it has astigmatic imaging properties. Such an optical element can be used in situations in which astigmatic imaging properties, for example for imaging strip-type objects, are required or in which the starting point is an astigmatism that has to be compensated for from the outset around which a fine adjustment is then possible.

The optical surface having different curvature in mutually perpendicular planes may be a surface of a cylindrical lens. As a result of such a configuration, decoupling of the adjustable imaging properties is possible in two mutually perpendicular planes. Under these circumstances, the respective gas pressure is adjusted in one of the two chambers to adjust the imaging properties in one of said planes. The imaging properties in the plane perpendicular thereto remain unaffected thereby.

The cylindrical lens may be a plano-convex cylindrical lens. The use of convex surfaces forming the boundary of the chamber offers advantages in the fluid supply since, in the region of a casing enclosing the optical components, that is to say in the edge region of the optical components, convex optical components are in each case at the greatest distance from one another. This is therefore advantageous, in particular, since the fluid-filled chamber should be designed as small as possible in order, on the one hand, to achieve a required pressure change or deformation by a small supply or removal of fluid and, on the other hand, to keep the optical element compact.

The control device may have a signal connection to a sensor arrangement that monitors the imaging properties of the optical element and/or the optical system, the control device impressing a pressure in the fluid filling as a function of the transmitted signal data of the sensor arrangement. Such a monitoring of the imaging properties results in the possibility of regulating the fluid pressure or the fluid pressures for the purpose of automatic compensation for imaging errors.

The sensor arrangement may have a position-sensitive sensor. Monitoring the imaging properties of the optical element and/or of the optical system is possible in a simple manner with such a sensor. An inexpensive embodiment of such a position-sensitive sensor is, for example, a quadrant detector.

Preferably, the position-sensitive sensor is a CCD array. A precise determination of the imaging properties and the use of known image processing algorithms for their monitoring is possible with such a sensor.

The control device may be designed so that it is capable of producing both underpressures and overpressures. This increases the adjustment range of the astigmatic imaging properties of the optical element. If an optical element having a boundary surface that can be elastically deformed by means of the fluid pressure is used, a concavely shaped boundary surface relative to the enclosed chamber can be achieved by an underpressure and a convexly shaped boundary surface can be achieved by an overpressure.

Preferably, the fluid is a gas. A fine adjustment of the shape change can be produced by means of a change in pressure if an elastically deformable boundary surface is used.

If an optical element irradiated by illumination light and a noble gas is used as fluid, particularly advantageous optical properties are produced, in particular with respect to the transmission of the fluid. Any reaction of the filling gas with the optical components or the casing surfaces is virtually ruled out.

Alternatively, the fluid may be a liquid. A liquid enables a relatively rapid adjustment of the imaging properties of the optical element if an elastically deformable boundary surface is used since only a small supply or removal of fluid volume compared with a gas is necessary to deform the boundary surface.

Exemplary embodiments of the invention are explained in greater detail below by reference to the drawing; in the drawing.

DETAILED DESCRIPTION OF THE INVENTION

Figure 1:
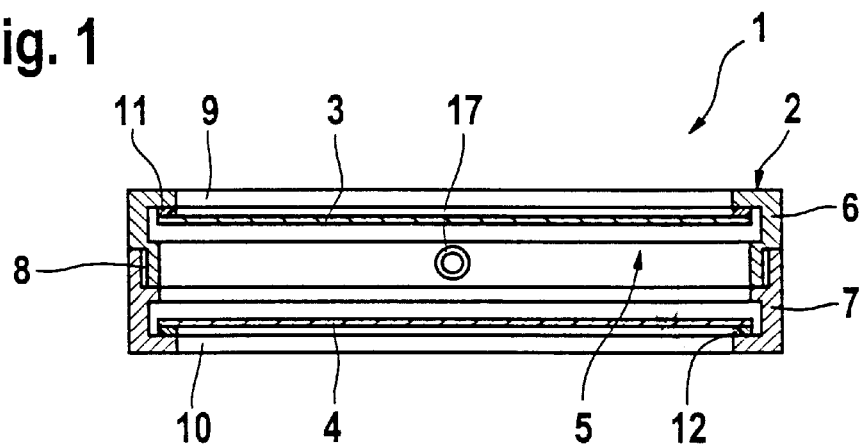
FIG. 1 shows a meridional section of a gas-filled optical transmission element having deformable optical surfaces.

The optical components shown in the drawing are parts of a projection exposure system for microlithography with whose aid astigmatic image errors arising therein can be compensated for.

Figure 2:
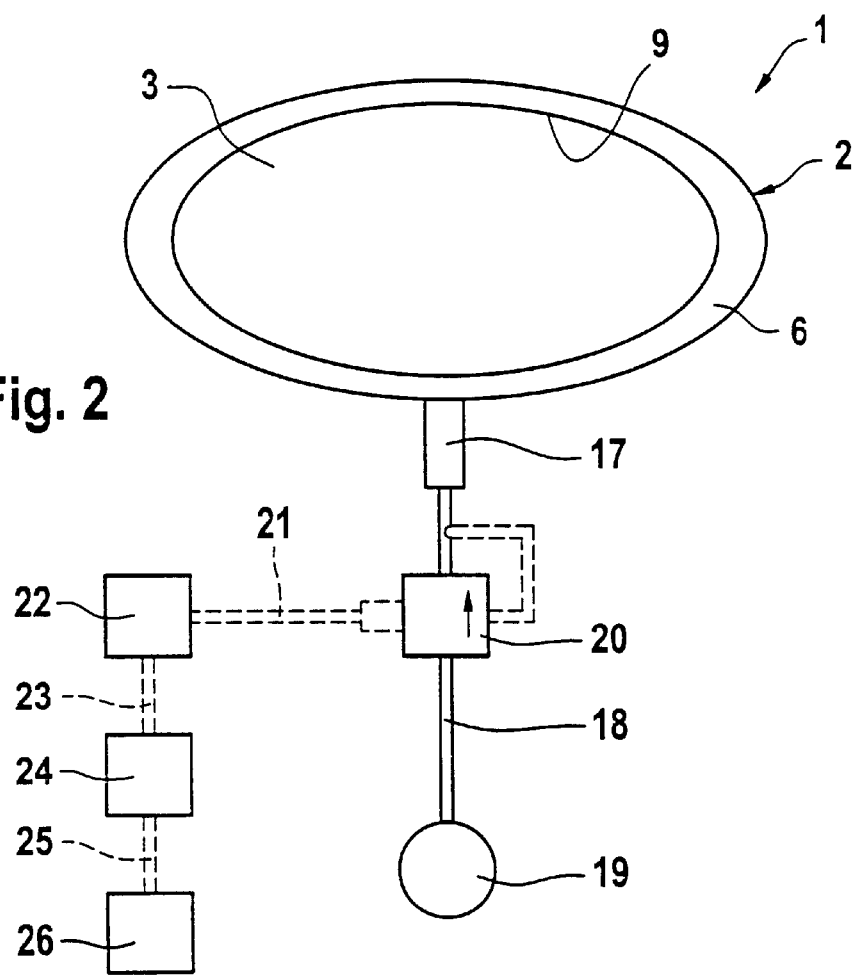
FIG. 2 shows a plan view of the transmission element of FIG. 1, in which a gas supply arrangement for the transmission element is additionally shown as a block circuit diagram.

An optical transmission element 1 shown in FIGS. 1 and 2 has a mounting 2 and two pellicles 3, 4, i.e. optically transparent membranes having a thickness of only a few micrometers. The mounting 2 and the pellicles 3, 4 form the boundary of a gas-filled chamber 5.

The mounting 2 has the shape of an elliptical cylindrical body (cf. FIG. 2). The optical axis of the transmission element 1 coincides with the line of intersection of the two major planes of the elliptical cylindrical body that is impressed by the mounting 2. The mounting 2 comprises two individual mountings 6, 7 for each pellicle 3, 4, which mountings are bonded together gastightly by means of an adhesive layer 8 extending in the circumferential direction of the mounting 2. The individual mountings 6, 7 each have aperture openings 9, 10 that are sealed by the pellicles 3, 4. The aperture openings 9, 10 have an elliptical edge contour.

To seal the gas-filled chamber 5 gastightly, the edge regions of the pellicles 3, 4 having an elliptical circumferential region of the individual mountings 6, 7 that is adjacent to the aperture openings 9, 10 are bonded by means of adhesive layers 11, 12.

The gas-filled chamber 5 has a fluid connection to a gas supply container 19 via a filling tube 17 and a gas supply line 18 (cf. FIG. 2).

A noble gas, for example helium, is used as gas filling. A liquid, for example water, can also be used as an alternative to a gas. The requirement for the suitability of a fluid for use in the transmission element 1 is sufficiently good optical properties (refracted index, transmission) in the region of the wavelengths that are used in projection exposure. If the transmission element is used in a flushed projection objective of a projection exposure system, care has to be taken that the refractive index of the fluid in the transmission element must be different from the refractive index of the flushing gas outside the transmission element. In the exemplary embodiments described below of the transmission element 1, it is assumed that the refractive index of the interior of the mounting 2 is always greater than outside of it.

For the purpose of better distinguishability, gas lines are shown as full lines and signal lines as broken lines in the drawing.

Disposed in the gas supply line 18 is a pressure-regulating valve 20 with which the pressure in the gas-filled chamber 5 is regulated by means of the pressure in the gas supply line 18. The pressure-regulating valve is signal-connected to a control circuit 22 via a signal line 21. The control circuit 22 is connected via a signal line 23 to an exposure control circuit 24. The latter is connected to a two-dimensional CCD array 26 via a signal line 25.

Figure 3:
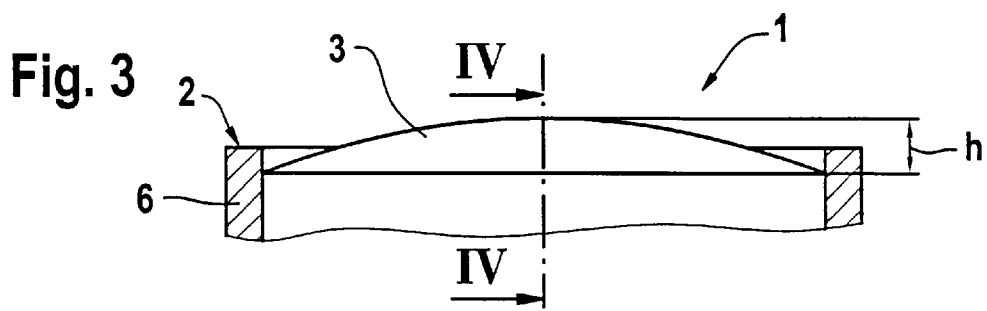
FIG. 3 shows a diagrammatic representation of a portion of the transmission element of FIG. 1, in which the gas pressure in the transmission element is greater than the ambient pressure.
Figure 4:
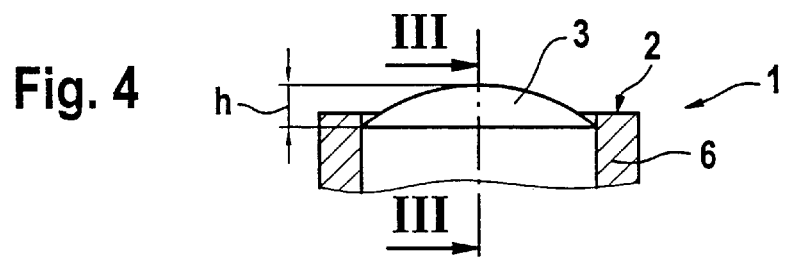
FIG. 4 shows a section along the line IV—IV of FIG. 3.
Figure 5:
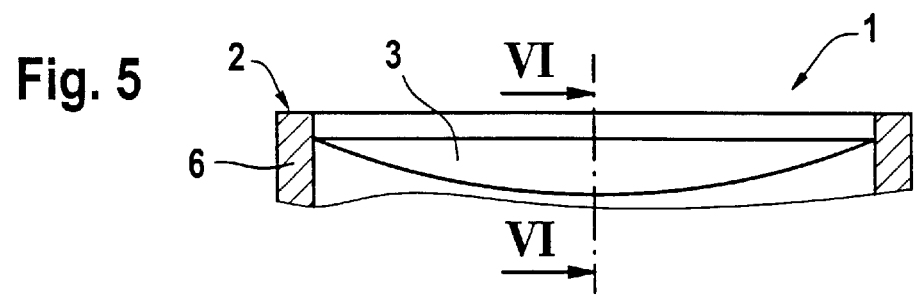
FIG. 5 shows a similar representation to FIG. 3, in which the gas pressure in the transmission element is less than the ambient pressure.

FIGS. 3 and 4 show diagrammatically the deformation of the pellicles 3 at a gas pressure in the gas-filled chamber 5 that is greater than the pressure in the environment of the transmission element 1. Because of this pressure difference, the pellicle 3 bulges outwards relative to the mounting 2 in such a way that the centre of the pellicle 3 is at a distance h with respect to the level of the edge region clamped in the mounting. In the meridional plane in which the long major axis of the elliptical base surface of the pellicle 3 is situated (sectional plane of FIGS. 1, 3 and 5), this bulging results in a smaller curvature than in the meridional plane perpendicular thereto (sectional plane of FIG. 4). These different curvatures result in a different refractive behaviour of the transmission element 1 in these two meridional planes.

The pellicle 4, which is not shown in FIGS. 3 and 4 likewise bulges outwards in a specularly symmetrical manner with respect to the central middle plane of the mounting 2, which plane is perpendicular to the optical axis of the transmission element 1, which, analogously to what has been described above, produces different imaging properties in the two meridional planes. In total, under these pressure conditions, the transmission element 1 is therefore a sort of biconvex astigmatic lens whose focal length in the meridional plane in which the longer major axis of the ellipse is situated is greater than in the meridional plane perpendicular thereto.

Figure 6:
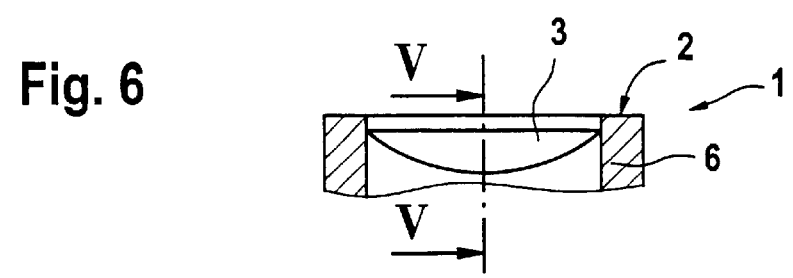
FIG. 6 shows a section along the line VI—VI of FIG. 5.

Analogous circumstances arise if a pressure prevails in the gas-filled chamber 5 that is less than the pressure in the environment of the transmission element 1. This situation is shown in the diagrammatic FIGS. 5 and 6.

The pellicle 3 (and specularly symmetrical thereto, the pellicle 4) now bulges inwards relative to the mounting 2 so that, in total, the transmission element 1 is a sort of biconcave astigmatic lens.

The transmission element 1 having the elastically deformable pellicles 3, 4 functions as follows:

The imaging quality of the optical arrangement is monitored with the aid of the CCD array 26, which is situated in an image plane of the optical arrangement of the projection exposure system. The structures imaged by means of the CCD array 26 in the image plane are transmitted via the signal line 25 to the exposure control circuit 24 and are evaluated in the latter, in particular with regard to imaging errors that occur, with the aid of known image processing algorithms.

From the imaging errors, the exposure control circuit 24 calculates a setpoint input for the astigmatic imaging properties of the transmission element 1 and this is transmitted via the signal line 23 to the control circuit 22. The latter calculates from said setpoint input a required pressure in the gas-filled chamber 5 that is transmitted as setpoint value via the signal line 21 to the pressure-regulating valve 20. The latter regulates the pressure in the gas-filled chamber 5 to the impressed required pressure. As a result of the corresponding bulging of the pellicles 3, 4, the astigmatic imaging properties of the transmission element 1 are then established that are necessary to compensate for the imaging errors of the optical system.

The astigmatic focal length ratio of the transmission element 1 can be set for a particular gas pressure in the gas-filled chamber 5 by the configuration of the clamped edge contour of the pellicles 3, 4. Edge-contour ellipses having different length ratios of the major axes yield correspondingly different imaging properties in the meridional planes assigned to the major axes.

Other shapes of the edge contour that bound a surface that is not centrosymmetrical with respect to its centre are conceivable for inputting in a controlled manner different imaging properties in different meridional planes, for example, any other oval shape or a rectangular shape.

Instead of a pellicle 3 or 4, a quartz plate made of crystalline quartz or quartz glass or a plate made of $CaF_2$ may also be used, said plates having to be correspondingly designed as thin in order to be able to be deformed by moderate pressures.

Instead of two pellicles 3, 4, only one pellicle may alternatively be used, the opposite optical surface forming the boundary of the gas-filled chamber being formed by a non-elastically-deformable optical component, for example a relatively thick glass plate. In this case, the pellicle or the alternatively usable deformable quartz or CaF$_2$ plate may also be provided with a reflecting coating so that the result is a mirror having an adjustable astigmatism instead of an optical transmission element.

Figure 7:
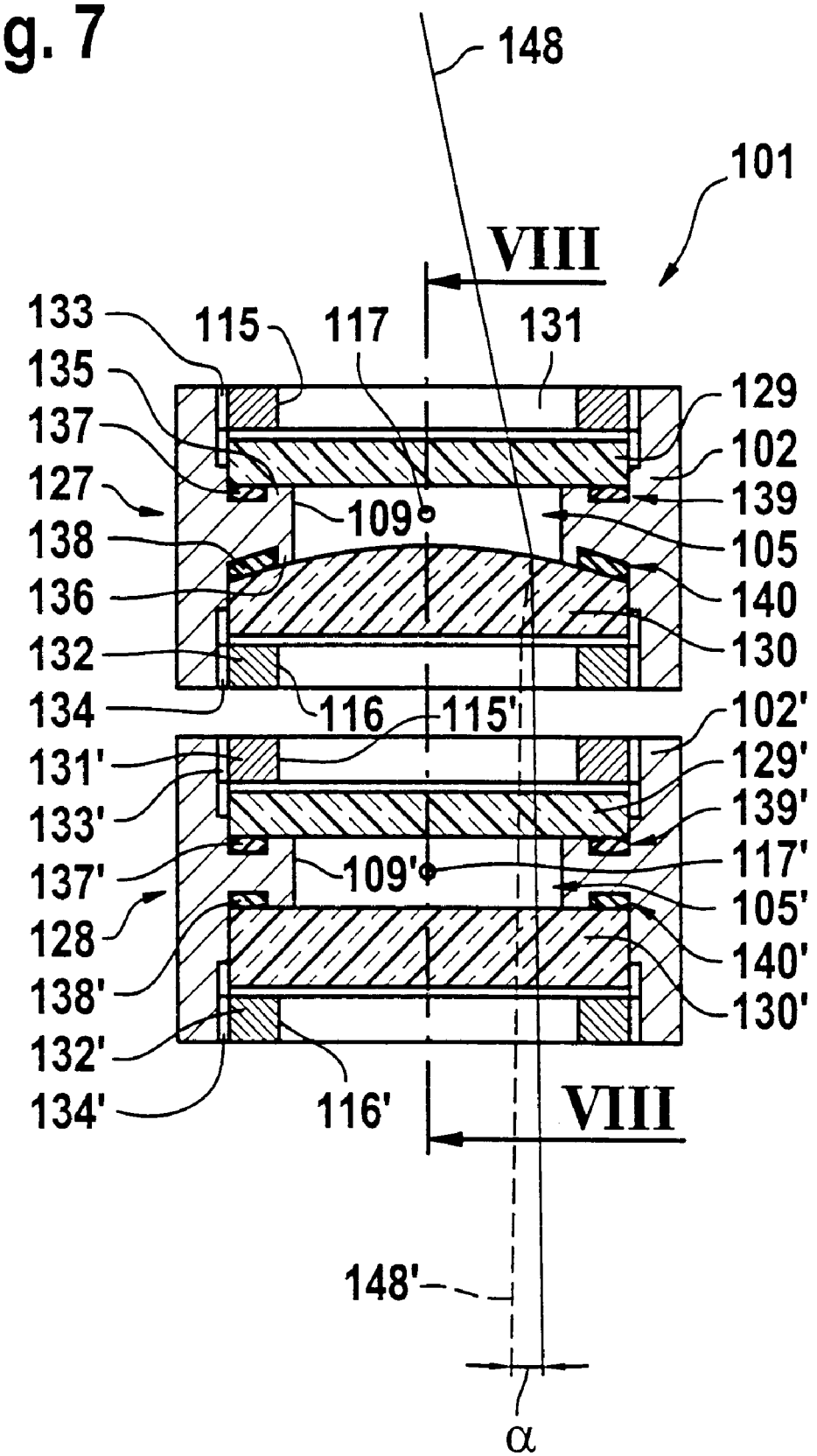
FIG. 7 shows a meridional section of an alternative gas-filled optical transmission element having non-elastically-deformable optical surfaces.
Figure 8:
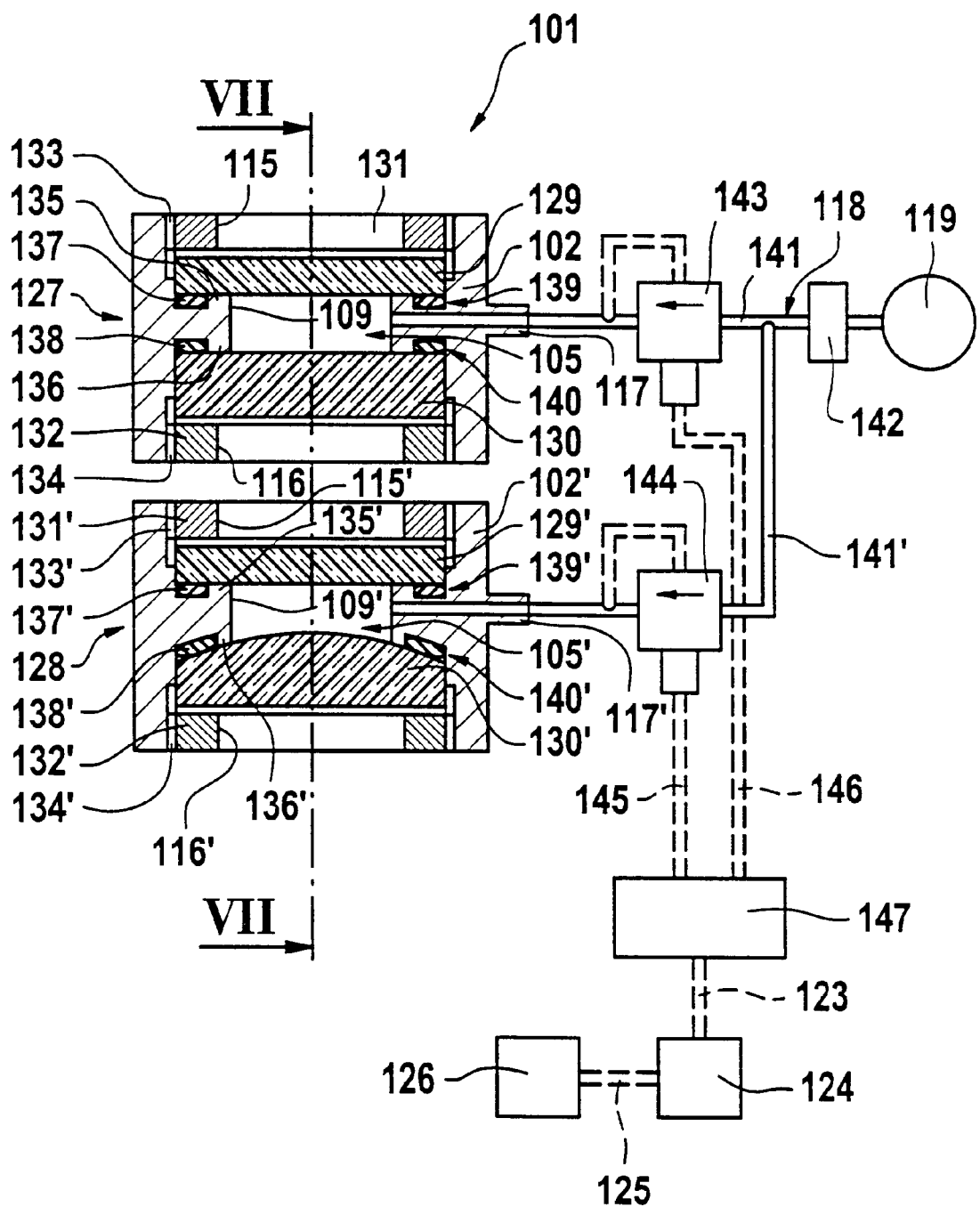
FIG. 8 shows a section along the line VIII—VIII of FIG. 7, in which a gas supply arrangement for the transmission element is additionally shown as a block circuit diagram.

Yet another alternative embodiment of a transmission element 101 whose astigmatic imaging properties are adjustable as a function of gas pressure is shown in FIGS. 7 and 8. Components that correspond to those that have already been described in FIGS. 1 to 6 are given reference symbols increased by 100 and are not explained in detail yet again.

The transmission element 101 has two optical components 127, 128 disposed consecutively along its optical axis. These are essentially of identical construction, but are rotated by 90° around the optical axis with respect to one another. Because of the substantial identity of the structure, only the optical component 127 will be described in detail below. If reference is made below to structural parts of the optical component 128, said structural parts are provided with reference symbols having a prime.

The optical component 127 has a round glass plate 129 situated at the top in FIG. 7 and having constant thickness, and a plano-convex cylindrical lens 130 disposed thereunder in FIG. 7. The glass plate 129 and the cylindrical lens 130 are disposed in a mounting 102 with which they form the boundary of a gas-filled chamber 105. The convexly curved surface of the cylindrical lens 130 is adjacent to the gas-filled chamber 105.

Both the glass plate 129 and the cylindrical lens 130 are made of quartz glass.

The glass plate 129 and the cylindrical lens 130 are held in the mounting 102 by means of locking rings 131, 132. In this connection, the locking rings 131, 132, which each have an external thread are screwed into matching internal threads 133, 134 of the mounting 102 and hold the glass plate 129 or the cylindrical lens 130, respectively, in the system against bearing shoulders 135, 136 that are formed in the mounting 102. Sealing rings 127, 138 that are situated in annular grooves 139, 140 that are formed in the bearing shoulders 135, 136 that seal the mounting 102 in a gastight manner against the glass plate 129 or the cylindrical lens 130, respectively.

Connected to the gas-filled chamber 105 is a filling tube 117. Through the latter, gas is supplied to the gas-filled chamber 105 via a line section 141 assigned to it and a gas supply line 118 from a gas reservoir 119. Disposed in the gas supply line 118 is a thermostatted temperature-control device 142.

Disposed in each of the line sections 141, 141' that are assigned to the gas-filled chambers 105, 105' via the filling tubes 117, 117' is a pressure-regulating valve 143, 144. These have a signal connection to a control circuit 147 via the signal lines 145, 146.

The transmission element 101 comprising the optical components 127, 128 having the non-elastically-deformable optical surfaces function as follows:

Analogously to the transmission element 1, the CCD array 126 is situated in an image plane of the optical system comprising the transmission element 101 of the projection exposure system. The exposure control circuit 124 derives therefrom input values for the astigmatic imaging properties of the transmission element 101 that are transmitted to the control circuit 147 via the signal line 123. From said input values, the control circuit 147 calculates the required pressure values for the pressure-regulating valves 143, 144 and transmits said required pressure values to the pressure-regulating valves 143, 144 via the signal lines 145, 146. The pressure-regulating valves 143, 144 then regulate the pressures in the gas-filled chambers 105 or 105' to the impressed required pressure values.

The refractive index of the gas in the gas-filled chambers 105, 105' is dependent on the gas pressure prevailing therein. The higher the gas pressure, the higher is the refractive index of the gas. As a result, the imaging properties of the optical components 127, 128 are dependent on the gas pressures prevailing in the respective gas-filled chambers 105, 105'.

This dependence is now described by reference to a light ray 148 that is drawn in FIG. 7 and extends in its plane. The light ray 148 serves only for the purpose of illustration and does not show any ray path used in practice in projection exposure.

Let it be assumed that, with a first, relatively high gas pressure in the gas-filled chamber 105 of the upper optical component 127 in FIG. 7, a refraction takes place at the convex surface of the cylindrical lens 130, which is such that the refracted light ray 148 passes through the subsequent optical surfaces in a precisely perpendicular manner.

If the gas pressure in the gas-filled chamber 105 is reduced, the refractive behaviour of the light ray 148 changes at the interfaces between the gas-filled chamber 105 and the glass plate 129 or the cylindrical lens 130, respectively. Since the angle of incidence of the light ray 148 is small with respect to the glass plate 129, the change in the refractive behaviour at the interface between the glass plate 129 and the gas-filled chamber 105 can be neglected for the purpose of simplifying the representation. The conditions at the greater angle of incidence of the light ray 148 on the convex surface of the cylindrical lens 130 are different. Due to the lower refractive index of the filling gas as a result of the lower gas pressure in the gas-filled chamber 105, there takes place at the convex surface of the cylindrical lens 130 a stronger refraction of the light ray 148. The further behaviour of this more strongly refracted light ray is shown by broken lines in FIG. 7 and denoted by the reference symbol 148'.

Because of the stronger refraction, the light ray 148' no longer extends perpendicularly to the subsequent optical surfaces. Although the refraction at the flat optical surface of the plano-convex cylindrical lens 130 results in a reduction in the deflection of the light ray 148' with respect to the original light ray 148, there remains, as a consequence of the pressure reduction in the gas-filled chamber 105, a deviation of the light ray 148' from the original light ray 148 by an angle α.

Since those surfaces of the subsequent optical elements of the optical component 128 that are parallel to the meridional section shown in FIG. 7 result only in its angular displacement of the light ray 148, these have no effect on the angle α.

In total, therefore, the focal lengths of the optical components 127, 128 acting as mutually perpendicular cylindrical lenses can be modified independently by changing the gas pressure in one of the gas-filled chambers 105 or 105'. This results in an adjustability of the astigmatism of the transmission element 101 by means of the ratio of the gas pressures in the gas-filled chambers 105, 105'. This adjustable astigmatism is used to compensate for imaging errors in the optical system of the projection exposure system.

An alternative astigmatic transmission element having non-elastically-deformable optical surfaces can also be implemented in that, instead of two optical components 127, 128, only one such optical component is used, two cylindrical lenses rotated around the optical axis by 90° with respect to one another that have different curvatures of the surfaces adjacent to the gas-filled chamber may be used instead of one glass plate and one cylindrical lens. In total, the transmission element therefore has, at a certain pressure, for example atmospheric pressure, an initial astigmatism that has optionally to be compensated for by a suitable optical element.

Since the change in the deflection of the transmitted light rays as a consequence of a gas-pressure-induced refractive index change depends on the absolute value of the angle of incidence or angle of emission at the optical interfaces of the gas-filled chambers 105, 105', in such a transmission element, different changes in the imaging properties are produced in the two planes perpendicular to the curved surfaces of the two cylindrical lenses in the event of gas pressure change in such a transmission element. This results in an amplification or attenuation of the initial astigmatism of the transmission element.

An astigmatism having a controllable ratio of the focal lengths in mutually perpendicular planes is therefore also used in such an optical component to compensate for astigmatic imaging errors. Optionally, such an astigmatic transmission element must furthermore be combined with an optical component, for example a zoom objective, that performs a rotational-symmetric imaging correction.

An astigmatic compensation element provided by the transmission elements described above is not restricted only to use in a projection exposure system, but can be used wherever a controllable astigmatism is necessary. Examples of such fields of application are laser resonators that have internal media, for example the laser medium, having thermal or radiation-induced birefringence or, also, the beam guidance of astigmatic laser beams.

Instead of astigmatism, other non-rotational-symmetric imaging properties having n-fold symmetry can also be adjusted by suitable configuration of the optical compensation element. The mounting of a transmission element that is constructed analogously to that in FIGS. 1 to 6 has, for this purpose, an edge contour shape whose symmetry is adapted to the n-fold symmetry of the imaging error to be corrected. An example of such an edge contour shape is a polygon. In the case of a compensation element having rigid optical surfaces in accordance with that shown in FIGS. 7 and 8, the optical surfaces forming the boundary of the gas-filled chamber correspondingly have an n-fold symmetry adapted to the imaging error to be corrected.

What is claimed is:

1. An optical system, in particular projection exposure system for microlithography, in particular having a slot-shaped image field or non-rotational-symmetric illumination,
    a) having an optical element comprising at least one chamber that is sealed from atmospheric pressure and is enclosed by boundary surfaces and that has a fluid filling, wherein at least one of the boundary surfaces is exposed at least partially by illumination light;
    b) having a fluid source that has a fluid connection to the chamber via a fluid supply line; and
    c) having a control device for the pressure of the fluid filling to adjust and maintain the image properties of the optical element;
    wherein
        the at least one enclosed chamber is configured in a non-rotationally symmetric way such that a change in the fluid pressure inside the at least one chamber results in a change in non-rotational-symmetric imaging properties of the optical element that have an n-fold symmetry relative to the optical axis of the optical element, where n is greater than 1.

2. The optical system as claimed in claim 1, wherein a change in the fluid pressure inside the at least one chamber results in a change in the astigmatic imaging properties of the optical element.

3. The optical system as claimed in claim 1, wherein at least that region of the surfaces forming the boundary of the chamber that is irradiated by illumination light is at least partially formed by an elastically deformable material, the edge contour of the elastically deformable region being non-rotational-symmetric.

4. The optical system according to claim 3, wherein the edge contour has an n-fold symmetry relative to the optical axis of the optical element, where n is greater than 1.

5. The optical system as claimed in claim 4, wherein the edge contour is elliptically shaped.

6. The optical system as claimed in claim 4, wherein the edge contour has the shape of a polygon.

7. The optical system according to claim 3, characterized in that the elastically deformable optical medium is held in its edge region by a holding device, the shape of the holding surface with which the optical medium is in contact with the holding device imposes the edge contour of the elastically deformable surface region.

8. The optical system as claimed in claim 7, wherein the optical medium is a pellicle.

9. The optical system as claimed in claim 7, wherein the optical medium is a quartz plate.

10. The optical system as claimed in claim 7, wherein the optical medium is a $CaF_2$ plate.

11. The optical system as claimed in claim 3, wherein the optical medium has a reflecting coating.

12. The optical system as claimed in claim 1, wherein at least one region of a surface of the surfaces forming the boundary of the chamber is irradiated by illumination light and is formed by at least one rigid optical surface having different curvature in mutually perpendicular planes.

13. The optical system as claimed in claim 12, wherein the optical element is formed from a combination of at least two optical components that each comprise at least one chamber that is sealed from atmospheric pressure and is enclosed by boundary surfaces, that has a fluid filling and that is irradiated by illumination light, the optical components having, at least in the region of one surface of the surfaces forming the boundary of the respective chambers in each case at least one optical surface having different curvature in mutually perpendicular planes; and wherein an independent control of the pressure of the fluid filling in the chambers assigned to the optical components is ensured by means of a control device.

14. The optical system as claimed in claim 13, wherein the optical element is designed so that, given equal pressure in the fluid filling in the chambers assigned to the optical components it has essentially rotational-symmetric imaging properties.

15. The optical system as claimed in claim 12, wherein the optical element is designed so that, given equal pressure in the fluid filling in the chambers assigned to the optical components, it has astigmatic imaging properties.

16. The optical system as claimed in one of claims 12, wherein the optical surface having different curvature in mutually perpendicular planes is a surface of a cylindrical lens.

17. The optical system as claimed in claim 16, wherein the cylindrical lens is a plano-convex cylindrical lens.

18. The optical system as claimed in claim 1, wherein the control device has a signal connection to a sensor arrangement that monitors the imaging properties of the optical element and/or the optical system, the control device impressing a pressure in the fluid filling as a function of the transmitted signal data of the sensor arrangement.

19. The optical system as claimed in claim 18, wherein the sensor arrangement has a position-sensitive sensor.

20. The optical system as claimed in claim 19, wherein the position-sensitive sensor is a CCD array.

21. The optical system as claimed in claim 1, wherein the control device is designed so that it is capable of producing both underpressures and overpressures.

22. The optical system as claimed in one claim 1, wherein the fluid is a gas.

23. The optical system as claimed in claim 22, wherein the fluid is a noble gas.

24. The optical system as claimed in claim 1, wherein the fluid is a liquid.

* * * * *

UNITED STATES PATENT AND TRADEMARK OFFICE
Certificate

Patent No. 6,583,850 B2　　　　　　　　　　　　　　　　　　　Patented: June 24, 2003

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Wolfgang Hummel, Schwäb Gmünd (DE); Hubert Holderer, Königsbronn (DE); Rudolf Von Bünau, Essingen (DE); Christian Wagner, Aalen (DE); Jochen Becker, Obenkochen (DE); Stefan Xalter, Obenkochen (DE); and Rainer Labus (DE).

Signed and Sealed this Twenty-fifth Day of November 2008.

DIANE I. LEE
*Supervisory Patent Examiner*
Art Unit 2851